(12) United States Patent
Ostrin et al.

(10) Patent No.: US 11,405,063 B2
(45) Date of Patent: Aug. 2, 2022

(54) RADIO TRAY ASSEMBLIES

(71) Applicant: VIASAT, INC., Carlsbad, CA (US)

(72) Inventors: Gregory D. Ostrin, Oceanside, CA (US); Thomas J. Rock, Oceanside, CA (US); Gregory A. Smyth, Escondido, CA (US)

(73) Assignee: VIASAT, INC., Carlsbad, CA (US)

( * ) Notice: Subject to any disclaimer, the term of this patent is extended or adjusted under 35 U.S.C. 154(b) by 86 days.

(21) Appl. No.: 17/150,200

(22) Filed: Jan. 15, 2021

(65) Prior Publication Data

US 2021/0258031 A1 Aug. 19, 2021

Related U.S. Application Data

(60) Provisional application No. 62/962,747, filed on Jan. 17, 2020.

(51) Int. Cl.
*H05K 7/20* (2006.01)
*H04B 1/16* (2006.01)

(52) U.S. Cl.
CPC ....... *H04B 1/1615* (2013.01); *H05K 7/20145* (2013.01); *H05K 7/20209* (2013.01)

(58) Field of Classification Search
CPC .... H02J 7/0027; H02J 7/0044; H02J 2310/22; H02J 7/0013; H05K 5/0086; H05K 5/0247; H05K 7/20145; H05K 7/1457; H05K 5/0204; H05K 5/0021; H04B 1/03; H04B 1/036; H04B 1/3833

USPC .......... 361/814, 752, 695, 600, 679.02, 703, 361/704, 716, 719, 796; 307/150, 64, 43; 165/80.3; 320/107, 112, 137

See application file for complete search history.

(56) References Cited

U.S. PATENT DOCUMENTS

| 6,784,570 | B1* | 8/2004 | Walls .................... | H02J 7/0044 320/107 |
| 7,733,658 | B1* | 6/2010 | Perkins, III .............. | H04B 1/03 361/752 |
| 8,059,412 | B2 | 11/2011 | Perkins, III et al. | |
| 8,135,358 | B1* | 3/2012 | Hesse .................. | H04B 1/0096 455/100 |
| 8,462,491 | B2* | 6/2013 | Perkins, III .......... | H05K 7/1457 361/679.02 |
| 9,326,401 | B2* | 4/2016 | Duran .................. | H05K 5/0086 |

(Continued)

*Primary Examiner* — Mandeep S Buttar
(74) *Attorney, Agent, or Firm* — Chang & Hale LLP

(57) ABSTRACT

Described herein are radio tray assemblies that include space for a specific radio and its power supply and that additionally provide cooling and power conversion and control functionalities. The disclosed radio tray assemblies are designed to have a form factor compatible with legacy radio systems (e.g., MIDS-LVT) while enabling installation of a new radio system (e.g., MIDS-JTRS). The disclosed radio tray assemblies are configured so that the radio and its power supply are secured to a tray so that the radio and power supply are side-by-side and parallel lengthwise. A cooling module or assembly of the disclosed radio tray assemblies is disposed immediately behind the radio and its power supply and is configured to cool these units using forced air cooling directed lengthwise through the radio and its power supply. A power converter and controller module converts input power into the power required by the radio power supply.

20 Claims, 13 Drawing Sheets

(56) References Cited

U.S. PATENT DOCUMENTS

2009/0168370 A1 7/2009 Perkins, III et al.
2019/0159356 A1* 5/2019 Perkins, III .............. H04B 1/03

* cited by examiner

RADIO TRAY ASSEMBLIES

CROSS-REFERENCE TO RELATED APPLICATIONS

This application claims priority to U.S. Prov. App. No. 62/962,747 filed Jan. 17, 2020 and entitled "RADIO TRAY ASSEMBLY," the entire contents of which is incorporated by reference herein for all purposes.

BACKGROUND

Field

The present disclosure relates to radio system assemblies.

Description of Related Art

Radio systems can be standardized to enable mass production and installation in a variety of vehicles, command centers, and mobile communications systems. From time to time, standardized radio systems can be updated to enable new communications technology and to incorporate updated components. When this happens, legacy radio systems may need to be replaced. Replacing legacy radio systems may cause a variety of problems and undesirable expenditures in updating vehicles, command centers, and mobile communications systems to accommodate the new radio system.

SUMMARY

In some aspects, the present disclosure provides a radio tray assembly that includes a tray forming a radio mounting portion and a radio power supply mounting portion adjacent to the radio mounting portion, the radio mounting portion configured to receive a radio and the radio power supply mounting portion configured to receive a radio power supply in an orientation such that the radio and the radio power supply have lengths that are parallel to each other. The radio tray assembly also includes a cooling module secured to the tray behind the radio mounting portion and the radio power supply mounting portion, the cooling module including a fan configured to direct air through the radio mounting portion and through the radio power supply mounting portion in a direction parallel to lengths of the radio mounting portion and the radio power supply mounting portion. The radio tray assembly also includes a power converter and controller module secured to the tray adjacent to the radio power supply mounting portion and configured to convert a received electrical signal to a targeted electrical signal to power a radio power supply mounted to the tray.

In some embodiments, the radio tray assembly further includes a radio secured to the radio mounting portion and a radio power supply secured to the radio power supply mounting portion. In further embodiments, the radio comprises a multifunctional information distribution system joint tactical radio system terminal (MIDS-JTRS) radio assembly.

In some embodiments, the radio tray assembly is configured to be installed to replace a multifunctional information distribution system low volume terminal (MIDS-LVT) radio assembly. In some embodiments, the cooling module is oriented with its length perpendicular to the length of the radio mounting portion and the length of the radio power supply mounting portion. In some embodiments, the cooling module includes a first cooling port configured to direct air through the radio mounting portion and a second cooling port configured to direct air through the radio power supply mounting portion. In some embodiments, the power converter and controller module is oriented with its length parallel to the length of the radio mounting portion and the length of the radio power supply mounting portion. In some embodiments, the power converter and controller module has a length that is greater than or equal to a sum of a length of the radio mounting portion and a width of the cooling assembly.

In some embodiments, the power converter and controller controls cooling of the cooling assembly based at least in part on power drawn by a radio installed on the radio mounting portion. In further embodiments, the power converter controller controls a speed of a fan of the cooling assembly based at least in part on the power drawn.

In some embodiments, dimensions of the radio tray assembly are less than or equal to 8.4 in. in height, 13.2 in. in width, and 21 in. in length. In some embodiments, dimensions of the radio mounting portion are less than or equal to about 7.5 in. in width and 13.5 in. in length. In some embodiments, dimensions of the radio power supply mounting portion are less than or equal to about 2.525 in. in width and 13.46 in. in length. In some embodiments, dimensions of the power converter and controller module are less than or equal to about 8.38 in. in height, 3 in. in width, and 20.88 in. in length. In some embodiments, dimensions of the cooling assembly are less than or equal to about 8.38 in. in height, 7.26 in. in width, and 10.13 in. in length.

In some embodiments, the electrical signal received by the power converter and controller module receives is 110 VAC, 220 VAC, or 28 VDC. In further embodiments, the targeted output signal is ±140 VDC.

In some embodiments, the power converter and controller includes user interface features that controls a power state of the radio tray assembly. In some embodiments, the power converter and controller is configured to display status information. In further embodiments, the status information is displayed using one or more LEDs.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

BRIEF DESCRIPTION OF THE DRAWINGS

Various embodiments are depicted in the accompanying drawings for illustrative purposes and should in no way be interpreted as limiting the scope of this disclosure. In addition, various features of different disclosed embodiments can be combined to form additional embodiments, which are part of this disclosure. Moreover, the drawings may not be to scale, so no size information should be inferred therefrom.

DETAILED DESCRIPTION OF SOME EMBODIMENTS

Figure 1A:
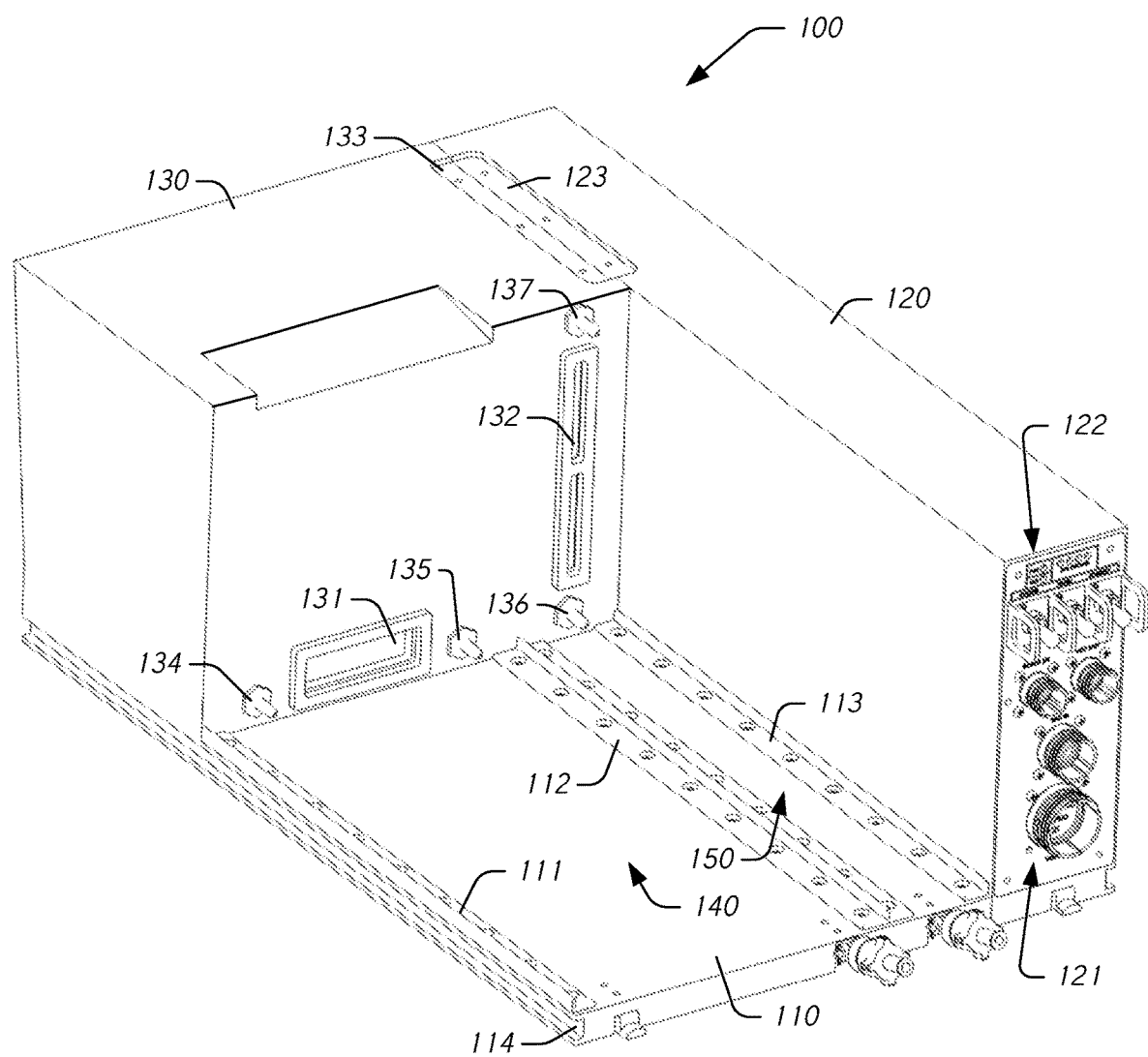
FIGS. 1A, 1B, 1C, 1D, 1E, 1F, and 1G illustrate various views of an example radio tray assembly that includes a tray, a power converter and controller module, and a cooling module.

The headings provided herein, if any, are for convenience only and do not necessarily affect the scope or meaning of the disclosure or claims.

Overview

Organizations, such as armed forces, can use standardized data links to provide radio and/or cabled communications. One such standardized data link used by U.S. and NATO armed forces is a tactical data link (TDL). TDLs can be used to transmit, relay, and receive tactical data. An example of a military TDL is Link 16, which enables real-time exchanges between communications systems of tactical data. Link 16 is a secure, jam-resistant, high-speed digital data link that operates in a frequency band between 960 MHz and 1215 MHz.

Certain armed forces utilize radios employing Link-16 data links. An example of such a radio system includes multifunctional information distribution systems (MIDS), which is an advanced Link-16 command, control, communications, and intelligence system incorporating high-capacity, jam-resistant, digital communications links for the exchange of near-real time tactical information, including data and voice, among air, ground, and sea elements. MIDS includes two families: low volume terminals (or MIDS-LVT) and joint tactical radio system terminals (or MIDS-JTRS). MIDS-LVT has been widely adopted and installed in a variety of platforms including aircraft, ships, and ground systems. MIDS-JTRS is a software-defined radio that can securely transmit data and voice. Because it is software defined, it can be quickly reprogrammed to operate at new frequencies and modes ("waveforms") with a download of new software.

MIDS-JTRS has been adopted as a replacement for MIDS-LVT systems. However, a MIDS-JTRS ground variant radio has not been developed to replace the MIDS-LVT. This makes it difficult and/or costly to update radio systems utilizing MIDS-LVT systems. In addition, personnel may be familiar with MIDS-LVT systems and it may be difficult and/or undesirable to learn a new system.

Accordingly, to address these and other issues, disclosed herein are radio tray assemblies that include space for a specific radio and its power supply (e.g., MIDS-JTRS) and that additionally provide cooling and power conversion and control functionalities. The disclosed radio tray assemblies are designed to have a form factor compatible with legacy radio systems (e.g., MIDS-LVT). In some embodiments, the radio tray assemblies are also designed to include user interface features identical or similar to legacy radio systems (e.g., MIDS-LVT), so that the legacy user interface features are available or presented when utilizing the updated or new radio systems (e.g., MIDS-JTRS).

The disclosed radio tray assemblies can be configured so that the radio and its power supply can be attached or secured to a tray so that the radio and power supply are side-by-side and parallel lengthwise. A cooling module or assembly of the disclosed radio tray assemblies can be disposed immediately behind the radio and its power supply and can be configured to cool these units using forced air cooling by directing air lengthwise through the radio and its power supply. In some embodiments, the cooling assembly can be oriented so that it is generally perpendicular to the lengths of the radio and its power supply as installed on the tray. A power converter and controller module or assembly of the disclosed radio tray assemblies converts input power into the power required by the radio power supply. In some embodiments, the power converter and controller module can be disposed parallel (length-wise) to the radio and its power supply. In various embodiments, the length of the power converter and controller module is a combination of the length of the radio and the width of the cooling assembly.

In some embodiments, the power converter and controller module is configured to control aspects of the cooling assembly. For example, the power converter and controller module can be configured to adjust a fan speed of the cooling assembly based at least in part on current drawn by the radio and its power supply. As another example, the power converter and controller module can be configured to adjust a fan speed of the cooling assembly based at least in part on ambient temperature and/or current drawn by the radio and its power supply.

The radio tray assemblies can be configured to be compatible with a radio that employs a tactical data link complying with Link-16 standards and may be a software-defined radio such as the MIDS-JTRS. The physical form factor of the radio tray assemblies can be compatible with platforms that utilize a TDL radio system such as MIDS-LVT, enabling such platforms to be updated to utilize a software-defined TDL radio system such as MIDS-JTRS. Advantageously, this allows platforms such as aircraft, ships, and ground communications to be updated to use new radio systems without the complexities and costs associated with completely updating such systems to fit the updated radios. This may speed and facilitate adoption of the new radio systems, thereby providing superior communication capabilities and improving conditions for those relying on these radio systems. The disclosed radio tray assemblies may also provide a familiar interface for persons operating the radio systems, making adoption of new radio systems easier and reducing user error associated with installation of new radio systems.

The description provided herein generally describes radio tray assemblies designed to fit MIDS-JTRS radio systems so that the combination is compatible with legacy MIDS-LVT radio system installations. However, it is to be understood that the disclosed radio tray assemblies can be compatible with different types of radio assemblies. It is also to be understood that the disclosed radio tray assemblies can be used to enable new radio systems to be physically compatible with legacy radio systems to reduce difficulties associated with updating communications system installations when new radio form factors become available.

Example Radio Tray Assemblies

Figure 1B:
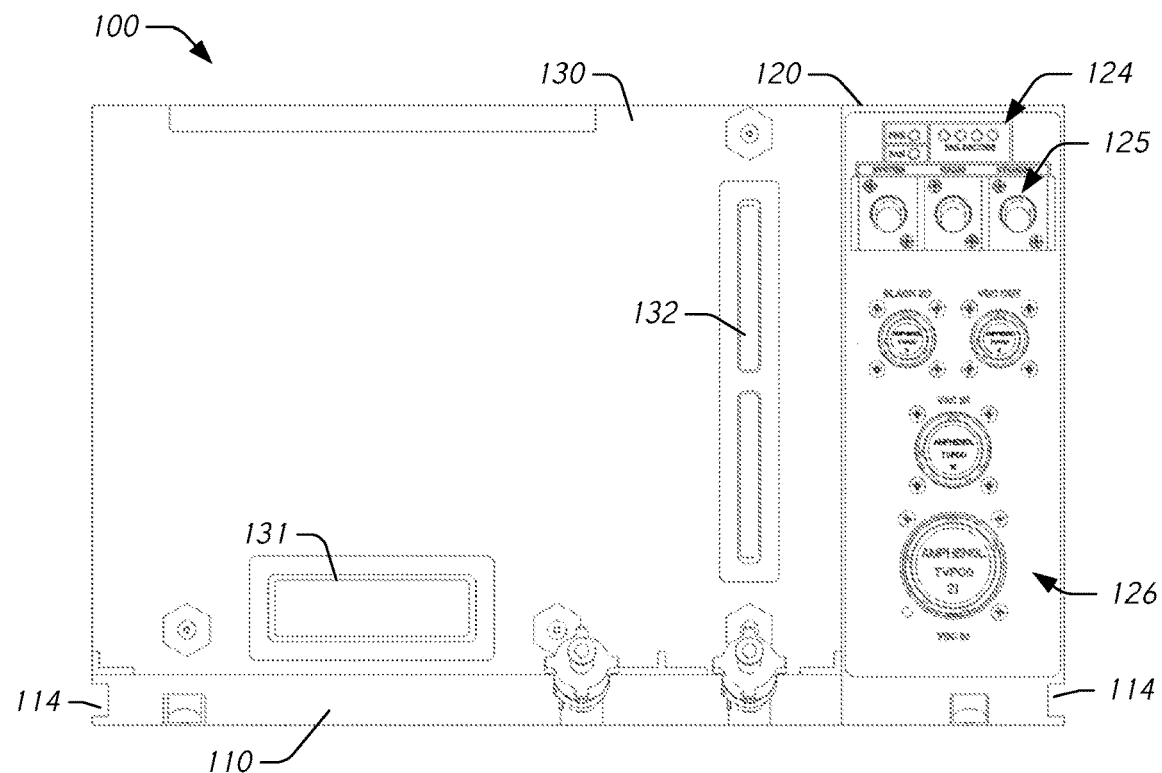
Figure 1C:
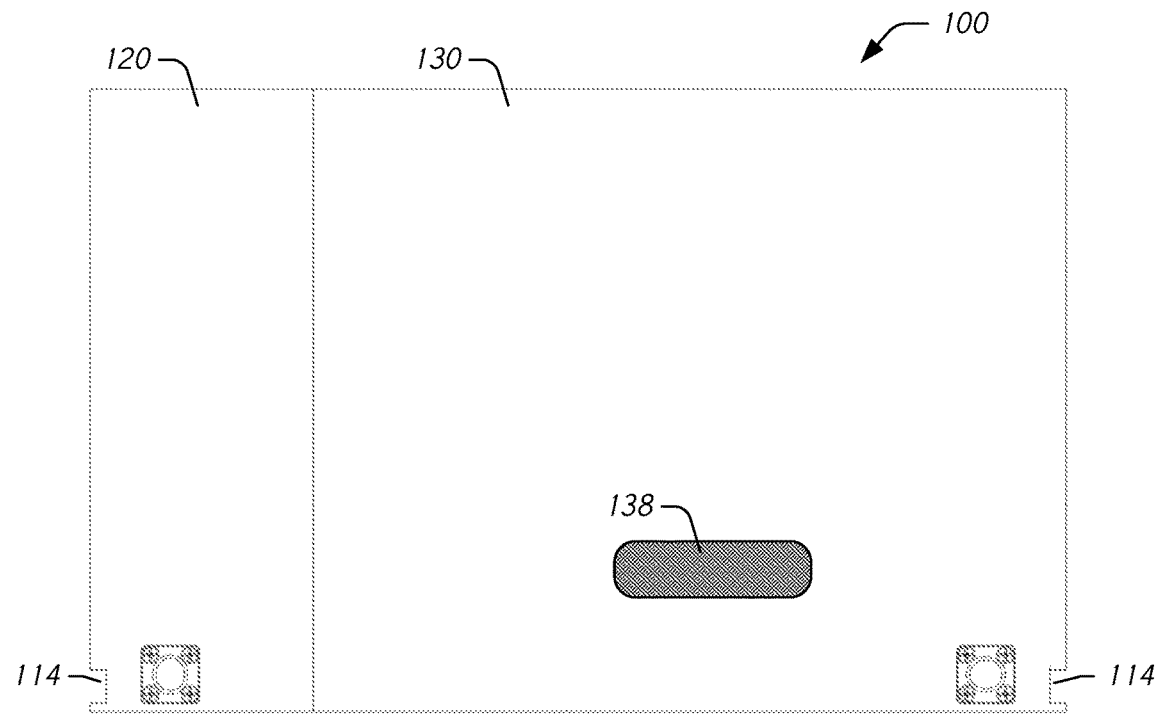
Figure 1D:
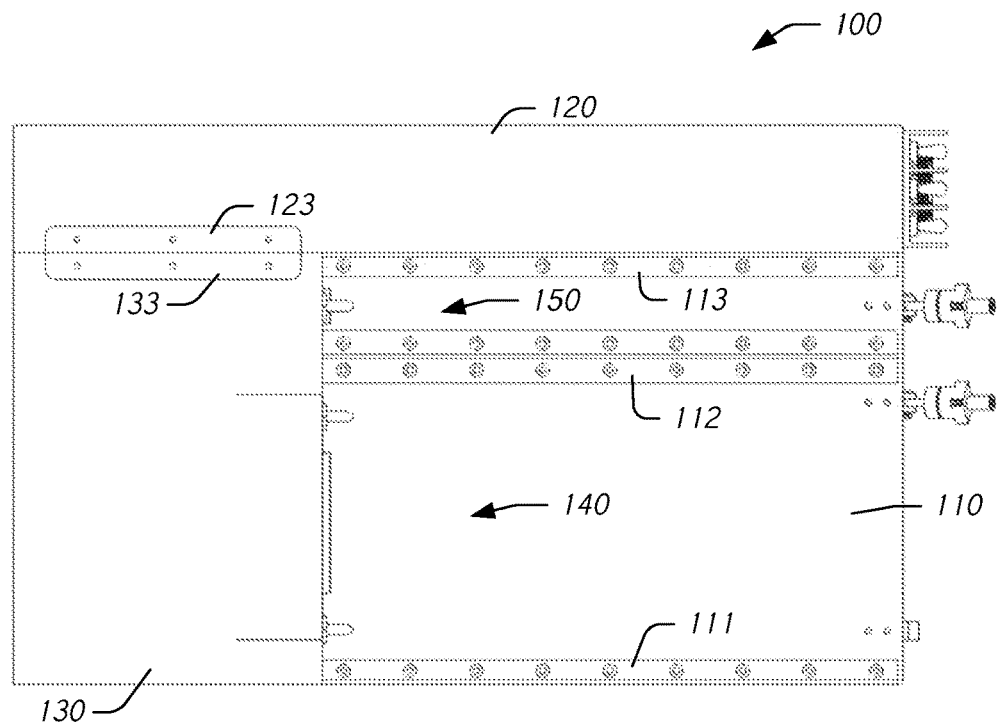
Figure 1E:
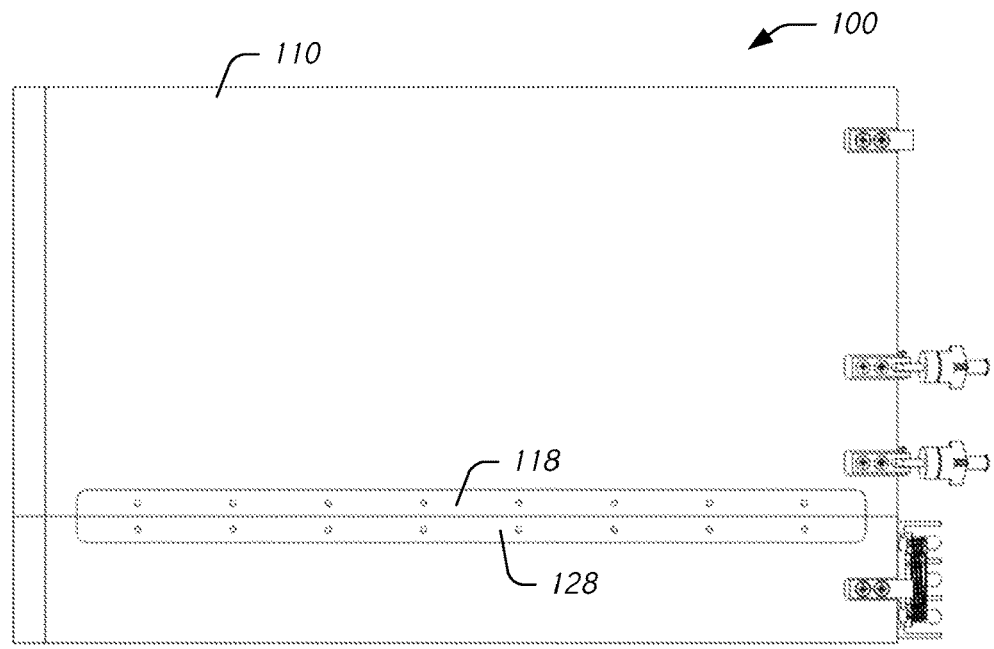
Figure 1F:
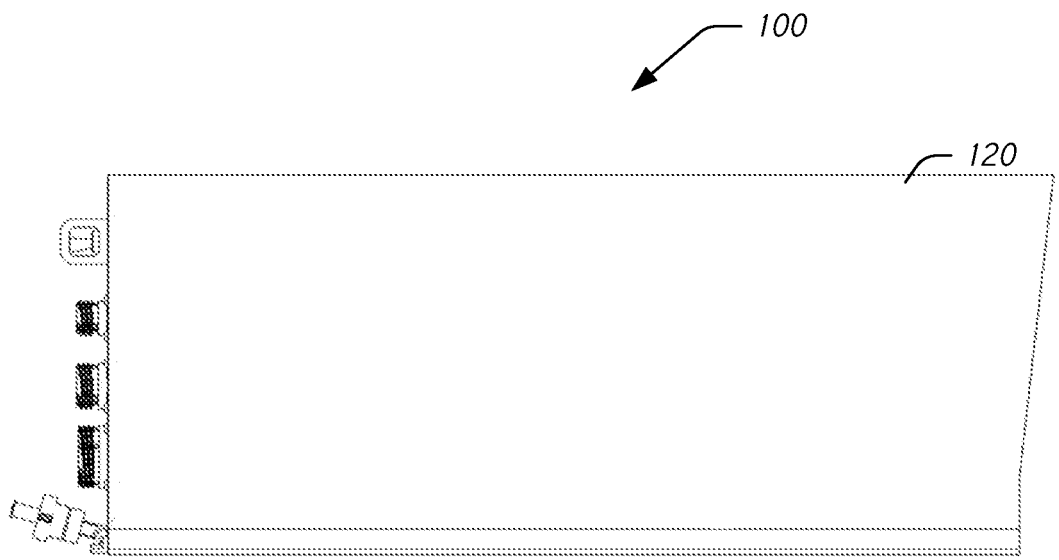
Figure 1G:
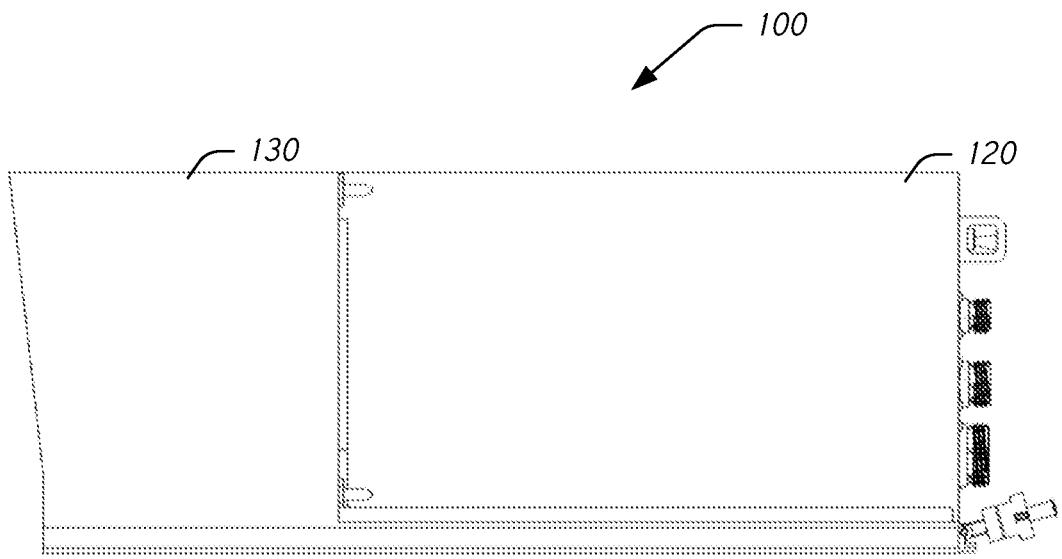

FIGS. 1A-1G illustrate various views of an example radio tray assembly 100 that includes a tray 110, a power converter and controller module 120, and a cooling module 130. FIG. 1A illustrates a perspective view, FIG. 1B illustrates a front view, FIG. 1C illustrates a back view, FIG. 1D illustrates a top view, FIG. 1E illustrates a bottom view, FIG. 1F illustrates a left side view, and FIG. 1G illustrates a right-side view of the radio tray assembly 100. As described herein, the radio tray assembly 100 can be compatible with a new or updated radio system, allowing the new radio system to be installed in platforms currently configured for a legacy radio. The radio tray assembly 100 with radio and radio power supply attached can be configured to fit within, and to be compatible with, existing spaces designed for legacy radios in various platforms (e.g., aircraft, ships, ground systems, etc.). For example, the tray 110 can form installation channels 114 that run along a length of the radio tray assembly 100 to allow it to be installed in a compatible platform or space. In some embodiments, the new or updated radio system can be the MIDS-JTRS that is commonly used by NATO and U.S. armed forces and the legacy radio can be the MIDS-LVT.

The radio tray assembly 100 is configured to receive a radio in a radio mounting portion 140 and a radio power supply in a radio power supply mounting portion 150 and to provide power and cooling to the attached radio and radio power supply. The tray 110 forms the radio mounting portion 140 between mounting rails 111, 112 and forms the radio power supply mounting portion 150 between mounting rails 112, 113. The radio mounting portion 140 is configured to removably attach a radio (not shown) to the tray 110 between the mounting rails 111, 112 and the radio power supply mounting portion 150 is configured to removably attach a radio power supply (not shown) to the radio tray 110 between the mounting rails 112, 113. The cooling module 130 also includes mounting pins 134, 135 that interface with the radio to further secure it to the tray 110 and mounting pins 136, 137 that interface with the radio power supply to further secure it to the tray 110. In some embodiments, fasteners (e.g., screws, bolts, clamps, brackets, etc.) can be used to secure the radio and the radio power supply to the tray 110, where the fasteners cooperate with holes or other similar features in the tray 110.

The radio mounting portion 140 and the radio power supply mounting portion 150 are adjacent to one another on the tray 110. This allows the radio and its power supply to be mounted next to each other to facilitate power transfer from the radio power supply to the radio. The radio mounting portion 140 and the radio power supply mounting portion 150 are each configured to respectively orient an attached radio and an attached radio power supply so that lengths of the radio and the radio power supply are parallel to each other. An attached radio and its power supply are also oriented so that the cooling module 130 directs air along their lengths, e.g., blowing air from the back of the radio towards its front or drawing in air so the air flow is from the front of the radio towards the back of the radio. The radio power supply mounting portion 150 is adjacent to the power converter and controller module 120 to facilitate power transfer from the power converter and controller module 120 to an attached radio power supply.

The power converter and controller module 120 is configured to convert external electrical power to a targeted or suitable electrical power required by the radio power supply. The radio power supply can then power the radio when both are attached to the tray 110.

The power converter and controller module 120 includes input elements 121 that receive cables and/or user input and output elements 122 that provide information or signals. As an example of output elements 122, the power converter and controller module 120 includes LEDs or other indicators 124 used to indicate various operating conditions (e.g., power, fan) or states (e.g., failure codes) of the radio tray assembly 100, the attached radio, and/or the radio power supply. In particular implementations, an LED can indicate a power state, another LED can indicate a fan state, and one or more additional LEDs can indicate a failure state or code. As an example of input elements 121, toggle switches 125 can be used by a user to change operating states of the radio tray assembly 100, the radio, and/or the radio power supply. In particular implementations, the toggle switches 125 can correspond to system power, radio power, and standby mode. As another example of input elements 121 and output elements 122, cable connectors 126 can be configured to receive electrical signals (e.g., alternating current voltage in or VAC in, direct current voltage in or VDC in) and/or to provide electrical signals (e.g., black I/O, direct current voltage out or VDC out) through connected cables. In some embodiments, the input elements 121 and/or the output elements 122 can be similar or equivalent to corresponding input elements and/or output elements of legacy radio systems.

The cooling module 130 is configured to direct air through cooling ports 131, 132 to provide forced air cooling along a length of an attached radio and an attached radio power supply to cool these units during operation. The cooling module 130 includes intake port 138 to allow air flow through the cooling module 130. The cooling module 130 can blow air out the cooling ports 131, 132 or it can draw air through the cooling ports 131, 132 to cool the radio and the radio power supply using forced air cooling. A radio and radio power supply compatible with the radio tray assembly 100 can be configured for forced air cooling along a length (e.g., front to back or back to front) of the radio and radio power supply. As described herein, the cooling module 130 can include a fan to direct air through the cooling ports 131, 132 and intake port 138.

The power converter and controller module 120 includes mounting feature 123 that cooperates with a mounting feature 133 of the cooling module 130 so that the power converter and controller module 120 and the cooling module 130 can be secured to one another using a suitable support bracket. The power converter and controller module 120 and the cooling module 130 can be removably attached to the tray 110 using any suitable combination of fasteners (e.g., screws, pins, bolts, brackets, etc.) and/or attachment features (e.g., friction fit, clamps, latches, etc.). For example, the tray 110 includes mounting feature 118 that cooperates with a similar mounting feature 128 of the power converter and controller module 120 that interfaces with a support bracket to secure the power converter and controller module 120 to the tray 110.

Figure 2A:
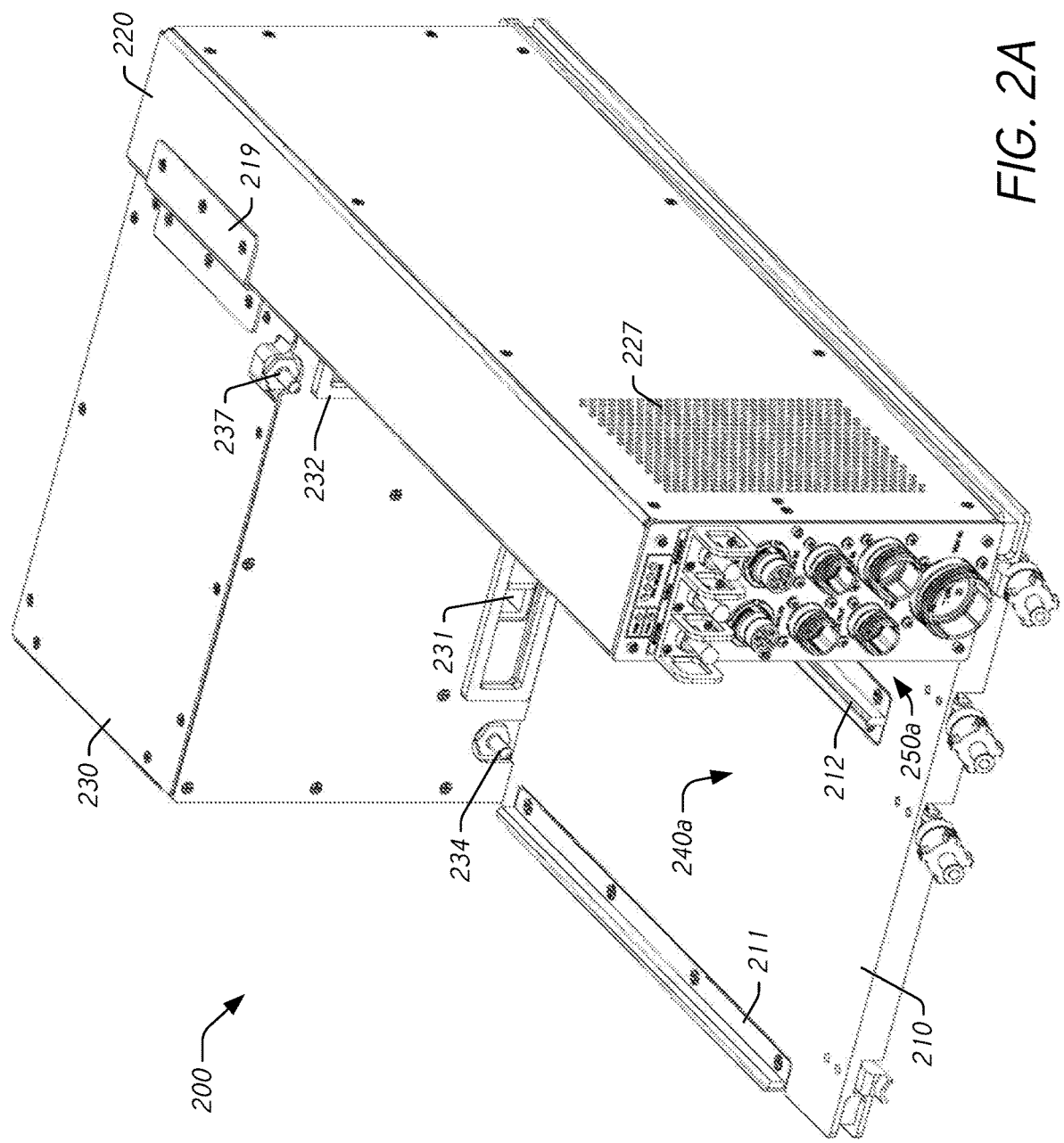
FIGS. 2A, 2B, and 2C illustrate another example radio tray assembly that includes a tray, a power converter and controller module, and a cooling module.
Figure 2B:
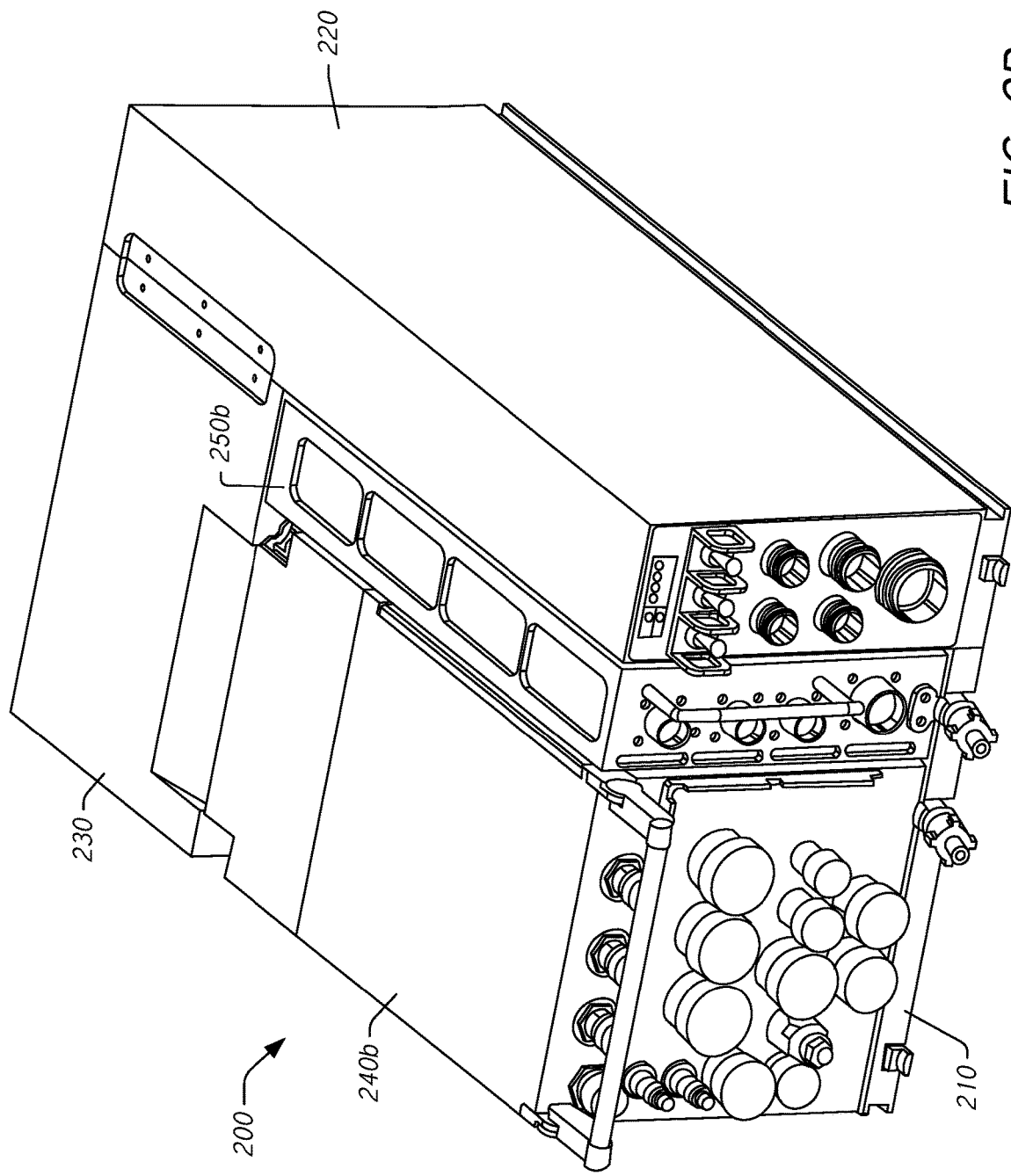
Figure 2C:
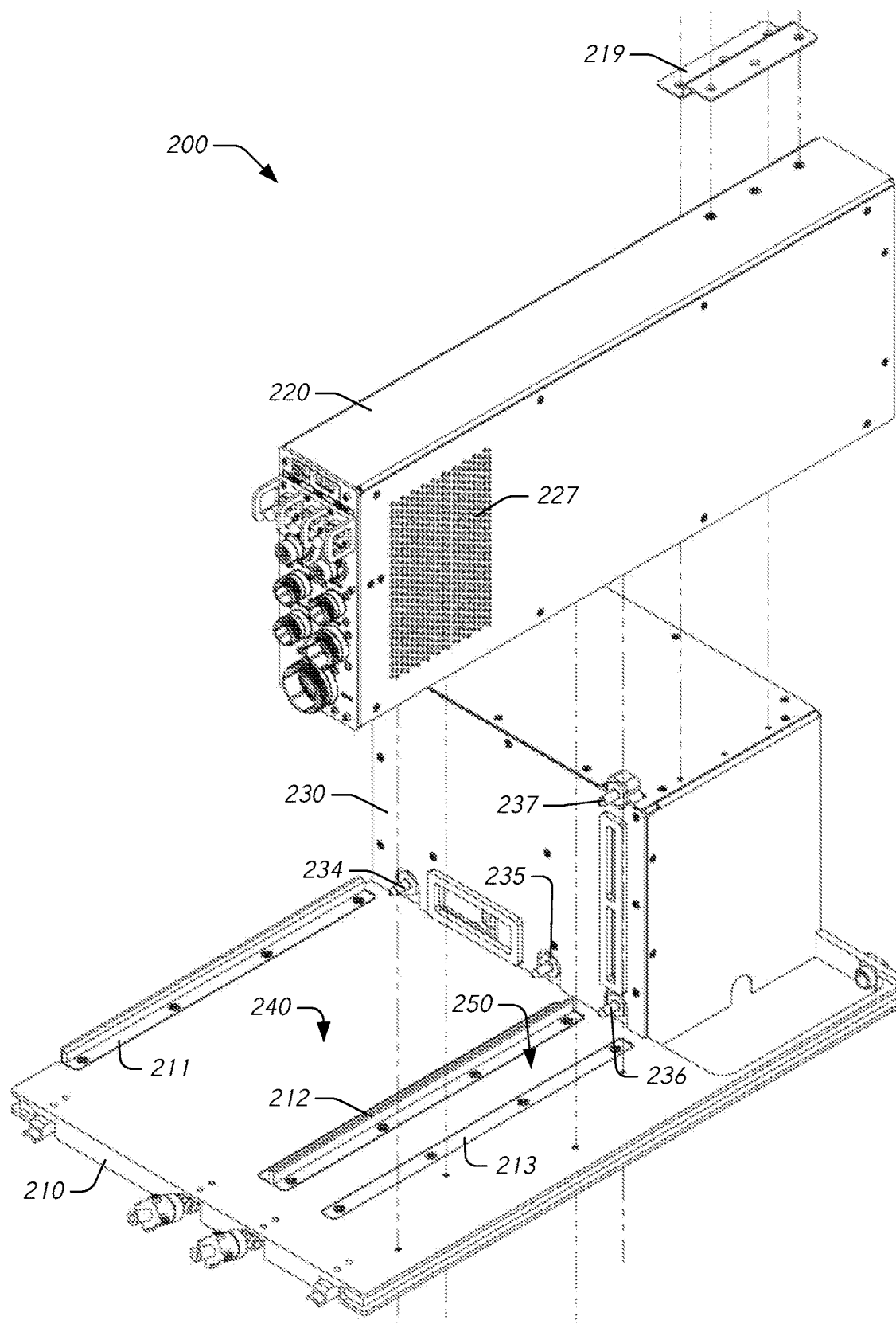

FIGS. 2A-2C illustrate another example radio tray assembly 200 that includes a tray 210, a power converter and controller module 220, and a cooling module 230. FIG. 2A illustrates a perspective view of the radio tray assembly 200 showing the radio mounting portion 240a of the tray 210 without the radio and the radio power supply mounting portion 250a of the tray 210 without the radio power supply. FIG. 2B illustrates a perspective view of the radio tray assembly 200 with the radio 240b attached to the radio mounting portion 240a of the tray 210 and the radio power supply 250b attached to the radio power supply mounting portion 250a of the tray 210. FIG. 2C illustrates a manner of attaching the power converter and controller module 220 to the tray 210 and to the cooling module 230. Elements in FIGS. 2A-2C can be similar to or the same as like-named elements described herein with reference to FIGS. 1A-1G.

The radio tray assembly 200 includes the tray 210, similar to the tray 110 described herein with respect to FIGS. 1A-1G. The tray 210 includes mounting rails 211, 212, 213, similar to the mounting rails 111, 112, 113 described herein with respect to FIGS. 1A-1G. The tray 210 forms the radio mounting portion 240a between the mounting rails 211, 212 and the radio power supply mounting portion 250a between the mounting rails 212, 213, similar to the radio mounting portion 140 and the radio power supply mounting portion 150 described herein with respect to FIGS. 1A-1G. Likewise, the cooling module 230 includes mounting pins 234, 235, 236, 237, similar to the mounting pins 134, 135, 136, 137 described herein with respect to FIGS. 1A-1G. The cooling module 230 also includes cooling ports 231 and 232 to direct air lengthwise along the radio 240b and the radio power supply 250b, when installed. The power converter and controller module 220 can include an air intake 227 to facilitate cooling of the power converter and controller module 220. The radio 240b is installed on the radio mounting portion 240a between the mounting rails 211, 212 and the radio power supply 250b is installed on the radio power supply mounting portion 250a between the mounting rails 212, 213. The radio 240b interfaces with the mounting pins 234, 235 and the radio power supply 250b interfaces with the mounting pins 236, 237.

The power converter and controller module 220 can be secured to the tray 210 using suitable fasteners. Similarly, the cooling module 230 can be secured to the tray 210 using suitable fasteners. A mounting bracket 219 is used to secure the power converter and controller module 220 to the cooling module 230. The power converter and controller module 220 and/or the cooling module 230 can be removably attached to the radio tray assembly 200. Advantageously, this design facilitates repairing, replacing, and/or upgrading these modules without needing to repair, replace, and/or upgrade the entire radio tray assembly 200.

Figure 3:
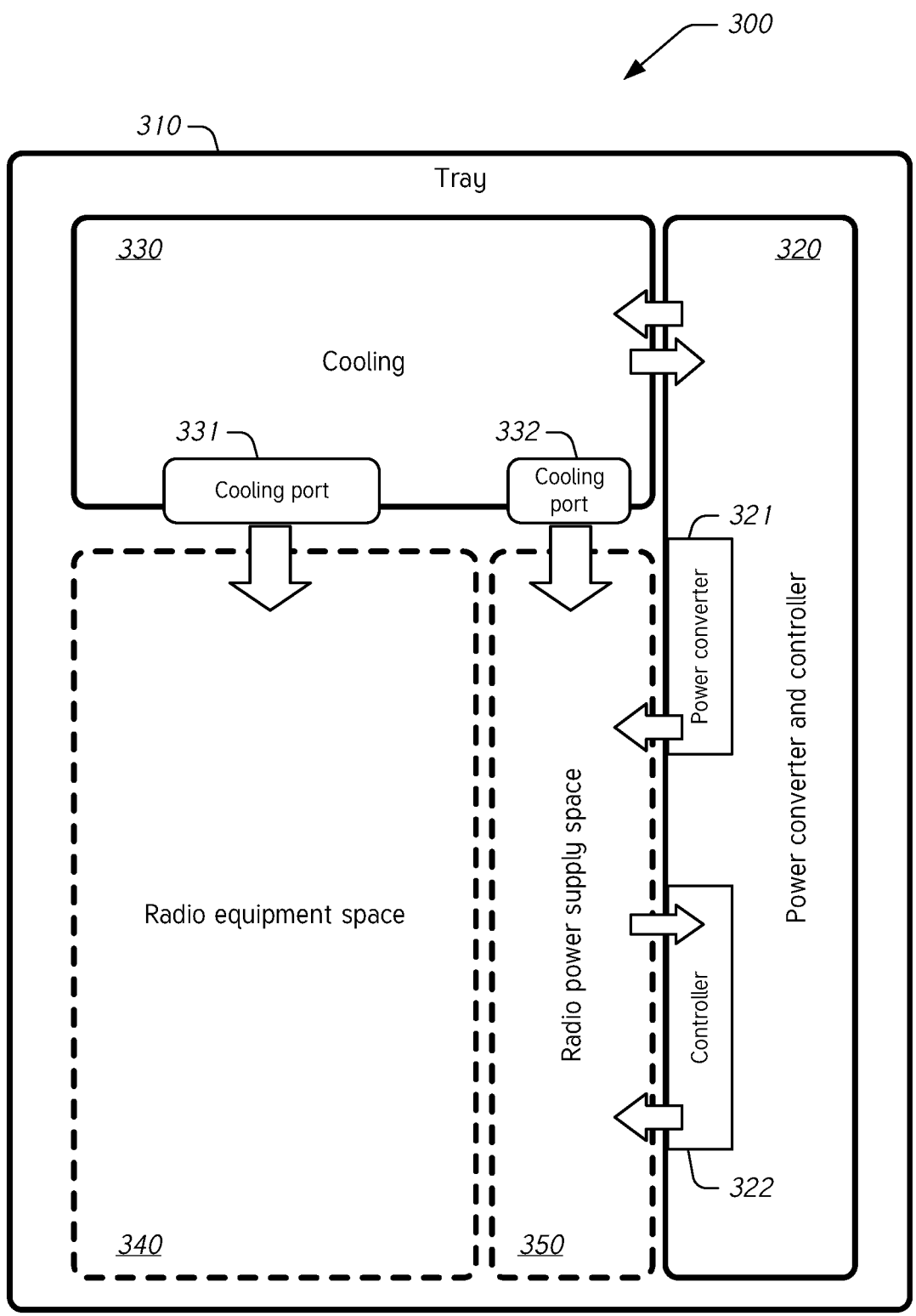
FIG. 3 illustrates a simplified block diagram of an example radio tray assembly to illustrate functionality of its components and relative positions and orientations of the components.

FIG. 3 illustrates a simplified block diagram of an example radio tray assembly 300 to illustrate functionality of its components and relative positions and orientations of its components. The radio tray assembly 300 includes a tray 310, a power converter and controller 320, and cooling 330. Radio equipment space 340 and radio power supply space 350 are configured to be adjacent to one another to facilitate the transfer of power and the exchange of electrical signals between an installed radio power supply and an installed radio. The radio equipment space 340 is configured to receive a radio and the radio power supply space 350 is configured to receive a radio power supply. The radio equipment space 340 can include a radio mounting portion, similar to the radio mounting portion 140 or 240a described herein with reference to FIGS. 1A-1G and 2A-2C. The radio power supply space 350 can include a radio power supply mounting portion, similar to the radio power supply mounting portion 150 or 250a described herein with reference to FIGS. 1A-1G and 2A-2C. Furthermore, elements in FIG. 3 can be similar to or the same as like-named elements described herein with reference to FIGS. 1A-1G.

The power converter and controller 320 can be oriented parallel to a radio installed in the radio equipment space 340 and to a radio power supply installed in the radio power supply space 350. The power converter and controller 320 can be positioned adjacent to the radio power supply space 350. This enables simplified electrical coupling between the power converter and controller 320 and an installed radio power supply. Similarly, the radio equipment space 340 can be adjacent to the radio power supply space 350 to facilitate electrical connections between an installed radio and an installed radio power supply. The power converter and controller 320 includes a power converter 321 and a controller 322.

The power converter 321 is configured to receive input electrical voltages and to provide output electrical voltages to an installed radio power supply. The output electrical voltages are configured to be suitable for powering an installed radio power supply and/or radio. The power converter 321 can be configured to convert electrical power from a variety of sources such as, but not limited to, wall power (e.g., 120 VAC, 220 VAC, etc.), a generator, a vehicle alternator, aircraft power, etc. The power converter 321 is configured to convert input electrical power to the electrical power required as input for the radio power supply including, but not limited to, 280 VDC, 3-phase 400 Hz VAC, or ±140 VDC (10%). The input electrical power can be provided through one or more cable connectors associated with the power converter and controller 320, examples of which are described herein with reference to FIGS. 1A-1G.

The controller 322 is configured to send and to receive electrical signals from an installed radio power supply and/or radio. The controller 322 can interface with one or more user interface features, such as toggles, LEDs, and/or cable connectors, associated with the power converter and controller 322, examples of which are described herein with reference to FIGS. 1A-1G. Signals received from an installed radio power supply and/or radio can be interpreted and displayed using LEDs or other display functionality. Settings from toggle switches can be used to control voltages sent to an installed radio power supply and/or radio for control purposes. Electrical signals received from the radio power supply and/or radio can be passed to output connectors associated with the power converter and controller 320. The controller 322 can receive signals indicating power drawn by an installed radio. In some embodiments, the power converter and controller 320 determines the amount of electrical power drawn by the radio and radio power supply. Feedback related to power consumption of the radio may be used to enable intelligent control of the cooling 330, as described herein.

The cooling 330 can be oriented perpendicular to the radio equipment space 340 and to the radio power supply space 350. This enables the cooling 330 to direct air lengthwise across an installed radio and radio power supply through the cooling ports 331, 332, respectively. The cooling 330 can be located immediately behind the radio equipment space 340 and the radio power supply space 350, allowing the cooling assembly to blow (or draw) air across the lengths of an installed radio and an installed radio power supply. In some embodiments, the cooling 330 is configured to cool an installed radio and radio power supply but not the power converter and controller 320.

A portion of the power converter and controller 320 is adjacent to a portion of the cooling 330 to enable electrical coupling between them. The cooling 330 can receive electrical power from the power converter and controller 320. The cooling 330 can receive control signals from the power converter and controller 320 to control fan speed and fan state (e.g., on or off), for example. The cooling 330 can transmit signals to the power converter and controller 320 to provide feedback regarding fan speed, fan voltage, fan power, fan state, or the like.

The power converter and controller 320 can be configured to control the cooling 330 using a cooling control algorithm. The cooling algorithm can be configured to monitor the power output of an installed radio power supply. Based on the power output, the power converter and controller 320 adjusts cooling (e.g., increases or decreases fan speed, turns the fan on or off). For example, increases in power consumption can result in the fan turning on and/or speeding up. Similarly, decreases in power consumption can result in the fan slowing down and/or turning off. In some embodiments, the power converter and controller 320 measures the electrical current out of the power converter 321 and determines power dissipation of an installed radio and radio power supply. Based on this determination, the power converter and controller 320 sets the fan speed. In some embodiments, the cooling 330 includes computing or processing elements to control cooling based on power consumption of an installed radio and/or radio power supply rather than the computing or processing being part of the power converter and controller 320. In some embodiments, the power converter and controller 320 and cooling 330 are integrated into a single unit or module.

The power converter and controller 320 can be oriented so that the length of the power converter and controller 320 is parallel to the lengths of both the radio equipment space 340 and the radio power supply space 350. The length of the power converter and controller 320 can be approximately equal to the length of the radio equipment space 340 or the radio power supply space 350 plus the width of the cooling 330. The cooling 330 can be oriented so that the length of the cooling 330 is perpendicular to the lengths of both the radio equipment space 340 and the radio power supply space 350. The length of the cooling 330 can be configured to be approximately the same as the combined widths of the radio equipment space 340 and the radio power supply space 350.

Example Radio Tray Assembly Configurations

FIGS. 4A-4D illustrate block diagrams of example radio tray assemblies 400a-400d to demonstrate permutations of configurations for a cooling module, power converter and controller module, tray, and mounting space for a radio and a radio power supply. Elements in FIGS. 4A-4D can be similar to or the same as like-named elements described herein with reference to FIGS. 1A-3.

Figure 4A:
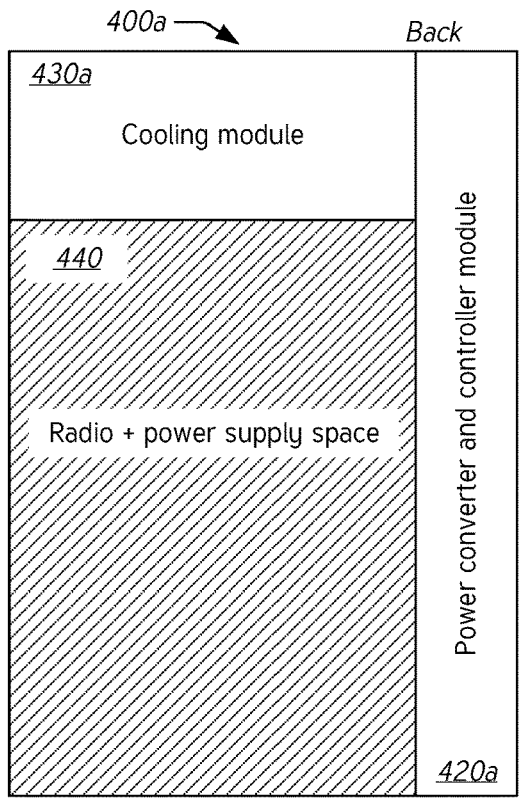
FIGS. 4A, 4B, 4C, and 4D illustrate block diagrams of example radio tray assemblies to demonstrate permutations of configurations for a cooling module, power converter and controller module, tray, and mounting space for a radio and its power supply.

FIG. 4A illustrates a radio tray assembly 400a where the power converter and controller module 420a has a length that is approximately the sum of the length of the radio and power supply space 440 plus the width of the cooling module 430a. The cooling module 430a has a length that is approximately the same as the width of the radio and power supply space 440.

Figure 4B:
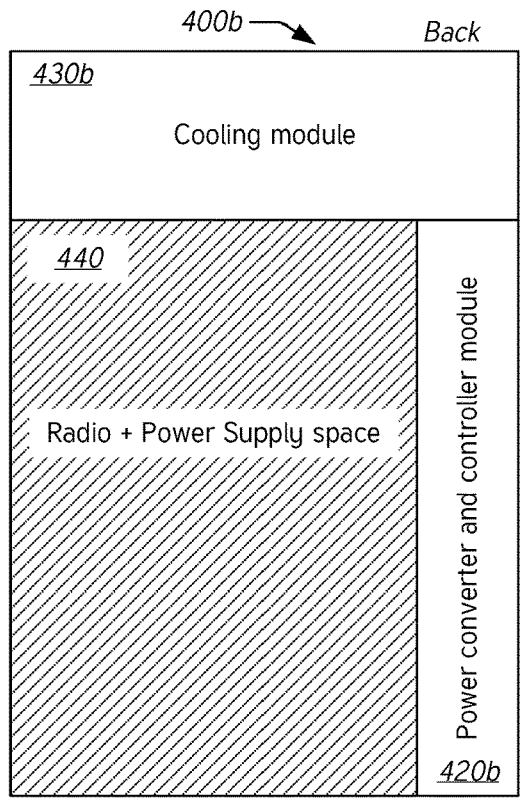

FIG. 4B illustrates a radio tray assembly 400b where the power converter and controller module 420b has a length that is approximately the same as the length of the radio and power supply space 440. The cooling module 430b has a length that is the approximately the same as the sum of the widths of the radio and power supply space 440 and the power converter and controller 420b.

Figure 4C:
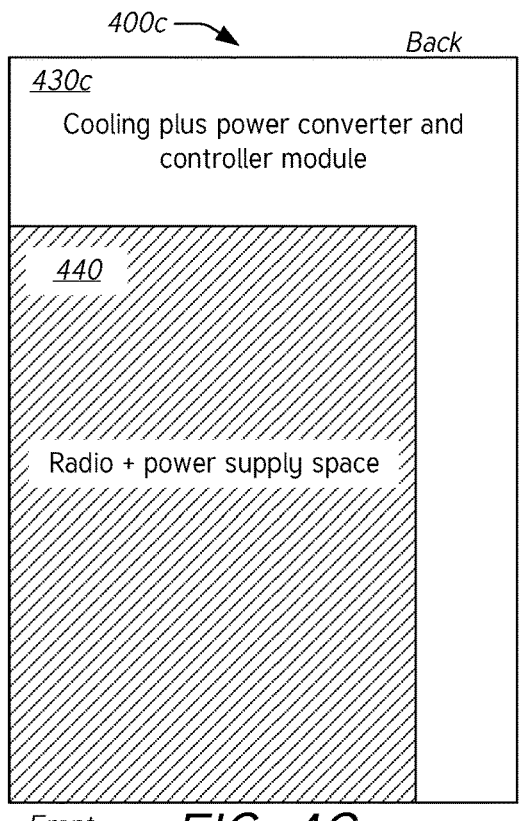

FIG. 4C illustrates a radio tray assembly 400c where cooling and power conversion and control are integrated into a single module, a cooling plus power converter and controller module 430c. The cooling plus power converter and controller module 430c has a portion with a width that extends approximately the entire width of the radio tray assembly 400c, a portion with a length that extends approximately the entire length of the radio tray assembly 400c and is generally L-shaped. The L-shaped module allows for a radio and its power supply to be installed in the radio and power supply space 440 so that the radio and power supply can be cooled and can receive power from the cooling and power converter and controller module 430c.

Figure 4D:
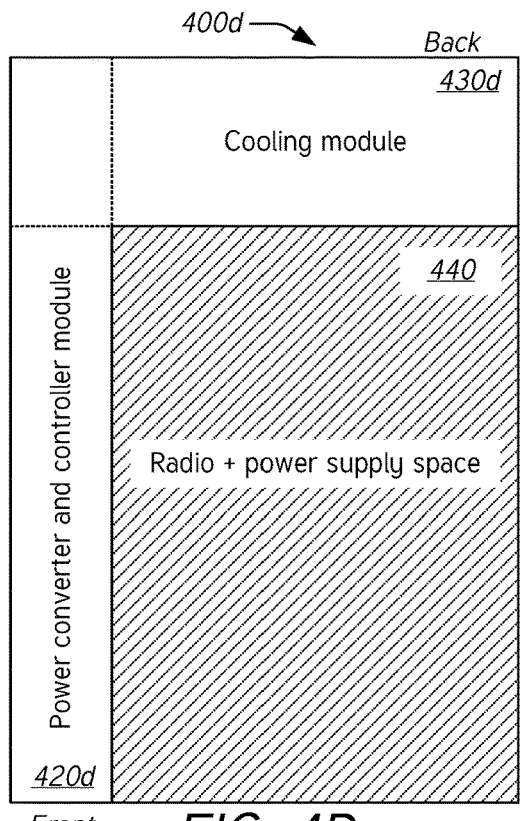

FIG. 4D illustrates that the radio and power supply space 440 may be moved to the other side of the radio tray assembly 400d. In such embodiments, the power converter and controller module 420d and the cooling module 430d can be configured in any way described with reference to FIG. 4A, 4B, or 4C.

Figure 5:
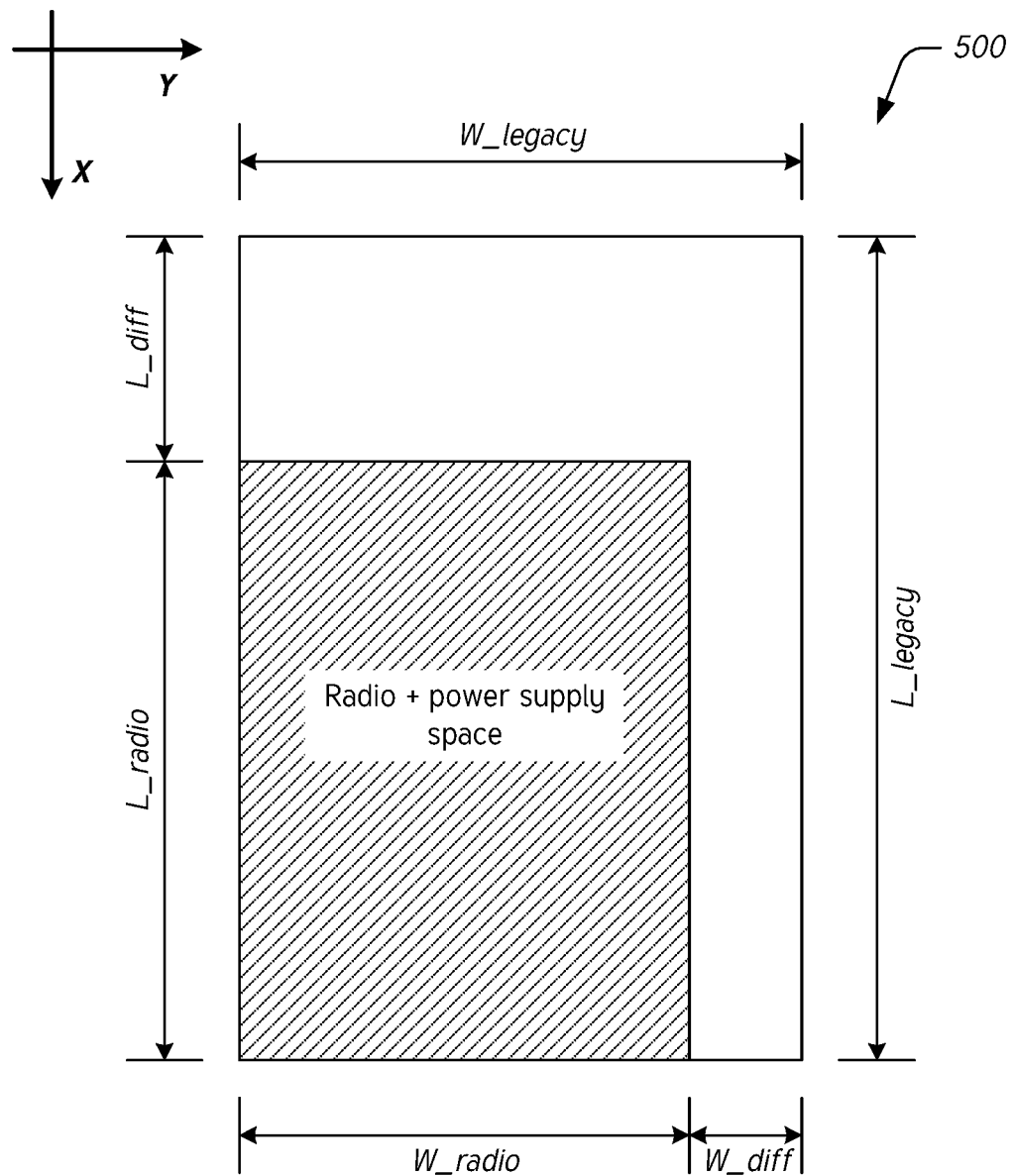
FIG. 5 illustrates another block diagram of an example radio tray assembly to demonstrate various dimensions and sizes of the radio tray assembly and its components.

FIG. 5 illustrates another block diagram of an example radio tray assembly 500 to demonstrate various dimensions and sizes of the radio tray assembly 500 and its components. Elements in FIG. 5 can be similar to or the same as like-named elements described herein with reference to FIGS. 1A-4D. The radio tray assembly 500 can have a height (H), a length (L), and a width (W), with a rectangular footprint and a volume that is substantially a rectangular prism. The radio tray assembly 500 can be configured to have a length that is approximately equal to a length of a legacy radio system (L_legacy) and a width that is approximately equal to a width of a legacy radio system (W_legacy). The radio tray assembly 500 can be configured to receive a radio and a radio power supply, either as separate units or line-replaceable units (LRUs) or a combined unit or LRU. The length of the radio and radio power supply can be L_radio and the width of the radio and radio power supply can be W_radio. The difference between L_legacy and L_radio can be referred to as L_diff while the difference between W_legacy and W_radio can be referred to as W_diff. These dimensions, L_diff and W_diff, can be related to the dimensions of the power converter and controller and cooling assembly of the radio tray assembly 500.

For clarity of description, a coordinate system can be employed when describing dimensions, positions, and orientations of the radio tray assembly 500, the radio and radio power supply, and the power converter and controller and cooling modules that are part of the radio tray assembly 500. For this purpose, an x-axis can be defined as pointing from the back toward the front of the radio tray assembly 500, a y-axis can be defined as being orthogonal to the x-axis and pointing from the right side to the left side of the radio tray assembly 500 (when facing the same way as the radio tray assembly 500), and a z-axis can be pointed upward.

With this coordinate system in mind, the lengths of the radio, radio power supply, and the power converter and controller module are generally taken to be parallel to the x-axis with their widths parallel to the y-axis while the length of the cooling module is taken to be parallel to the y-axis and its width parallel to the x-axis. This convention assumes that each module is generally a rectangular prism and the longer portion of its footprint is referred to as its length while the shorter portion of its footprint is referred to as its width. The height of each module may be similar, when attached to the tray, and is taken to be the dimension parallel to the z-axis.

In some embodiments, the cooling module is configured to have a width approximately equal to L_diff and a length approximately equal to W_radio. In such embodiments, the power converter and controller module is configured to have a width approximately equal to W_diff and a length approximately equal to L_legacy. In certain embodiments, the cooling module is configured to have a width approximately equal to L_diff and a length approximately equal to W_legacy. In such embodiments, the power converter and controller module is configured to have a width approximately equal to W_diff and a length approximately equal to L_radio. In any of these embodiments, the cooling module is configured to direct air substantially parallel to the x-axis, or length-wise along the radio and the radio power supply, to cool the radio and its power supply. Moreover, the power converter and controller module is configured to be adjacent to the radio power supply such that a portion of its length (e.g., the portion being about L_radio in length) is adjacent to the radio power supply to facilitate providing power and transmitting and receiving electrical signals.

In certain embodiments, the dimensions of the space for the radio are less than or equal to about 7.62 in. (H)×7.5 in. (W)×13.5 in. (L), the dimensions of the space for the radio power supply are less than or equal to about 7.62 in. (H)×2.525 in. (W)×13.46 in. (L), the dimensions of the power converter and controller are less than or equal to about 8.38 in. (H)×3 in. (W)×20.88 in. (L), and the dimensions of the cooling assembly are less than or equal to about 8.38 in. (H)×7.26 in. (W)×10.13 in. (L). In such embodiments, the dimensions of the radio tray assembly 500 are less than or equal to about 8.4 in. (H)×13.2 in. (W)×21 in. (L).

In some embodiments, the dimensions of the space for the radio are about 7.62 in. (H)×7.5 in. (W)×13.5 in. (L), the dimensions of the space for the radio power supply are about 7.62 in. (H)×2.525 in. (W)×13.46 in. (L), the dimensions of the power converter and controller are about 8.38 in. (H)×3 in. (W)×20.88 in. (L), and the dimensions of the cooling assembly are about 8.38 in. (H)×7.26 in. (W)×10.13 in. (L). In such embodiments, the dimensions of the radio tray assembly 500 are about 8.4 in. (H)×13.2 in. (W)×21 in. (L). In various embodiments, each dimension can be in a range that differs from the stated dimension by 5%, by 10%, and/or by 20%.

In some embodiments, the height for the space for the radio, the space for the radio power supply, the power converter and controller, the cooling assembly, and/or the radio tray assembly 500 can be at least about 6 in. and/or less than or equal to about 10 in., at least about 7 in. and/or less than or equal to about 9 in., or at least about 7.5 in. and/or less than or equal to about 8.5 in.

In some embodiments, the space for the radio can have a width that is at least about 6 in. and/or less than or equal to about 9 in., at least about 6.75 in. and/or less than or equal to about 8.25 in., or at least about 7.125 in. and/or less than or equal to about 7.875 in. The space for the radio can have a length that is at least about 10.8 in. and/or less than or equal to about 16.2 in., at least about 12.15 in. and/or less than or equal to about 14.85 in., or at least about 12.8 in. and/or less than or equal to about 14.2 in.

In some embodiments, the space for the radio power supply can have a width that is at least about 2 in. and/or less than or equal to about 3 in., at least about 2.25 in. and/or less than or equal to about 2.75 in., or at least about 2.4 in. and/or less than or equal to about 2.65 in. The space for the radio power supply can have a length that is at least about 10.8 in. and/or less than or equal to about 16.2 in., at least about 12.15 in. and/or less than or equal to about 14.85 in., or at least about 12.8 in. and/or less than or equal to about 14.2 in.

In some embodiments, the power controller and converter can have a width that is at least about 2.4 in. and/or less than or equal to about 3.6 in., at least about 2.75 in. and/or less than or equal to about 3.25 in., or at least about 2.85 in. and/or less than or equal to about 3.15 in. The power controller and converter can have a length that is at least about 16.75 in. and/or less than or equal to about 25 in., at least about 18.75 in. and/or less than or equal to about 23 in., or at least about 20 in. and/or less than or equal to about 22 in.

In some embodiments, the cooling module can have a width that is at least about 5.75 in. and/or less than or equal to about 8.75 in., at least about 6.5 in. and/or less than or equal to about 8 in., or at least about 7 in. and/or less than or equal to about 7.6 in. The cooling module can have a length that is at least about 8 in. and/or less than or equal to about 12.25 in., at least about 9 in. and/or less than or equal to about 11 in., or at least about 9.5 in. and/or less than or equal to about 10.5 in.

In some embodiments, the radio tray assembly 500 can have a width that is at least about 11 in. and/or less than or equal to about 16 in., at least about 12 in. and/or less than or equal to about 15 in., or at least about 12.5 in. and/or less than or equal to about 14 in. The radio tray assembly 500 can have a length that is at least about 17 in. and/or less than or equal to about 25 in., at least about 19 in. and/or less than or equal to about 23 in., or at least about 20 in. and/or less than or equal to about 22 in.

Figure 6:
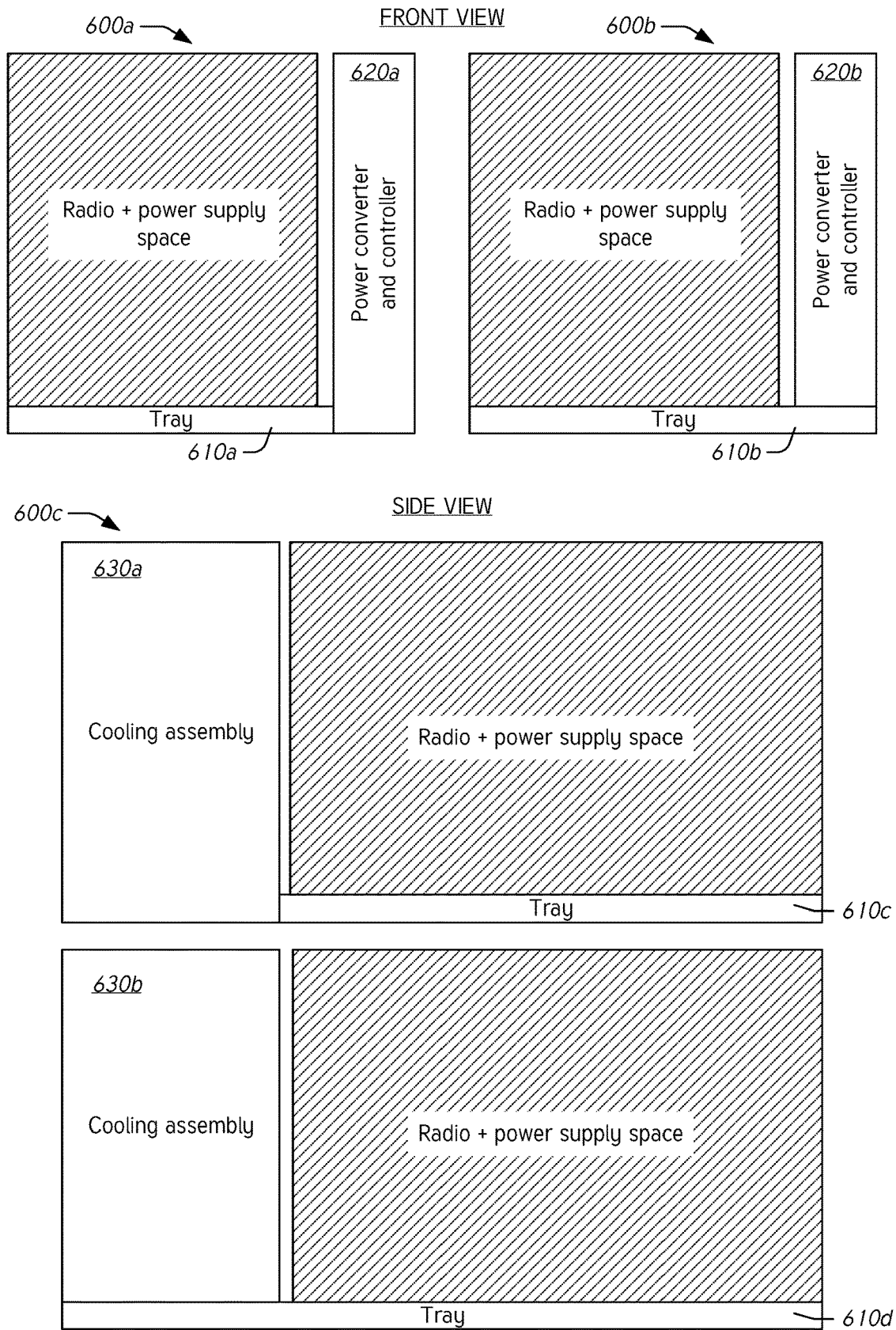
FIG. 6 illustrates another block diagram of an example radio tray assembly to demonstrate configurations of a tray with respect to a cooling module and a power converter and controller module.

FIG. 6 illustrates another block diagram of example radio tray assemblies 600a-600d to demonstrate configurations of a tray 610a-610d with respect to a cooling assembly 630a, 630b and a power converter and controller module 620a, 620b. Elements in FIG. 6 can be similar to or the same as like-named elements described herein with reference to FIGS. 1A-5.

Radio tray assembly 600a includes a tray 610a that is mounted to a side of the power converter and controller module 620a. Radio tray assembly 600b includes a tray 610b upon which is mounted the power converter and controller module 620b. Radio tray assembly 600c includes a tray 610c that is mounted to a front of the cooling assembly 630a. Radio tray assembly 600d includes a tray 610d upon which is mounted the cooling assembly 630b. Thus, a tray of a radio tray assembly can have a footprint that is approximately the size of the entire footprint of the radio tray assembly or the footprint of the tray can be less than the entire footprint of the radio tray assembly where one or both of the power converter and controller module and/or the cooling assembly extends the footprint of the tray to form the entire footprint of the radio tray assembly. In some embodiments, the footprint of the tray extends at least to cover a combined footprint of the radio and radio power supply and does not extend past a maximum targeted footprint of the radio tray assembly, including the combined footprints of the radio, radio power supply, power converter and controller module, and cooling assembly.

Example Power Converter and Controller Modules

Figure 7:
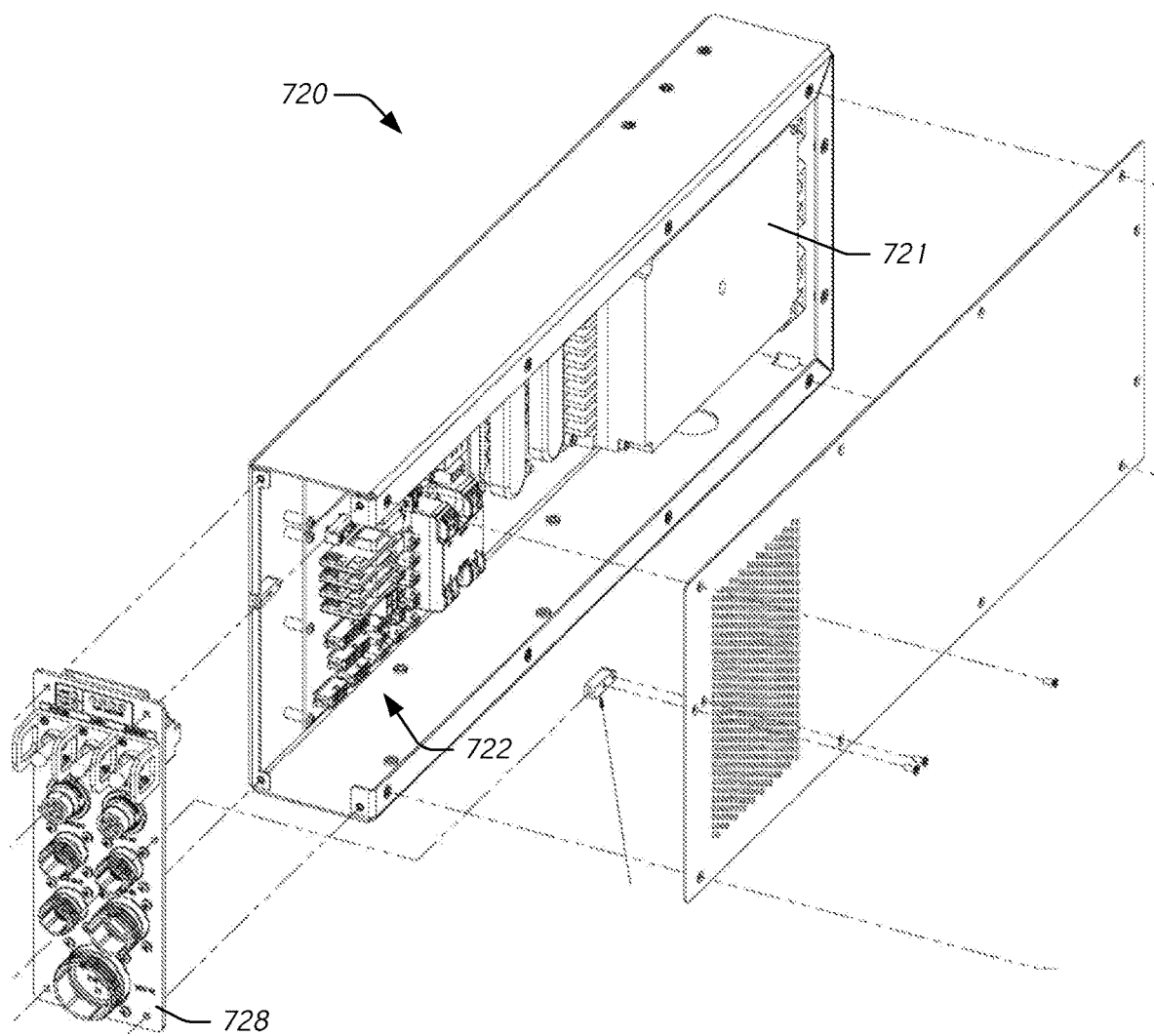
FIG. 7 illustrates an example power converter and controller assembly.

FIG. 7 illustrates an example power converter and controller assembly 720. Any of the power converter and controllers described herein with respect to FIGS. 1A-6 can be the same as or similar to the power converter and controller assembly 720. The power converter and controller assembly 720 includes a power converter 721 and a controller 722. The power converter 721 provides the functionality of the power converter 321 described herein with respect to FIG. 3. The controller 722 provides the functionality of the controller 322 described herein with respect to FIG. 3. The power converter and controller assembly 720 includes a faceplate 728 that includes one or more input elements and/or one or more output elements. The input elements can be switches, buttons, connectors, or the like, as described elsewhere herein. The output elements can be LEDs, displays, connectors, or the like, as described elsewhere herein. The power converter and controller assembly 720 is configured to interface with a radio power supply LRU and/or radio LRU. The power converter and controller assembly 720 can itself be an LRU. The power converter 721 can be configured to receive an input voltage or signal (e.g., 110 VAC, 220 VAC, 28 VDC) and output a targeted voltage or signal (e.g., ±140 VDC±10%-15%) to power a radio LRU through a radio power supply LRU.

In some embodiments, the power converter and controller assembly 720 is configured to control a cooling assembly using a cooling algorithm. The cooling algorithm can be the same as or similar to the cooling algorithms described herein. The cooling algorithm can cool the radio and radio power supply based at least in part on power provided to the radio power supply rather than controlling based on measured or sensed temperature. Advantageously, the cooling algorithm can improve power consumption, control fan noise, reduce complexity (e.g., by removing thermocouples from the cooling assembly), and the like. In some embodiments, the cooling algorithm can be controlled based at least in part on a measure of ambient temperature. The cooling algorithm is enabled due at least in part to the interconnectedness of the cooling assembly and the power converter and controller assembly.

The toggle switches of the faceplate 728 can allow a user to control aspects of an associated radio unit through the power converter and controller assembly 720. Toggle switches can be a power toggle which controls power to the radio, a standby toggle which puts the assembly or radio unit in a standby mode, and an assembly power toggle that controls power to the radio tray assembly (e.g., controls power to the power converter and controller assembly 720). In some embodiments, the faceplate 728 provides these controls as part of the radio tray assembly and the radio unit does not include similar or comparable user interface features on the radio unit. This may be because such functionality is directed to other parts of the platform in which the radio tray assembly is installed.

The faceplate 728 includes LEDs that provide indicators regarding power status, fan status, and failure indicators. The power converter and controller assembly 720 is configured to convert signals from the radio unit and/or the radio power supply unit into signals to drive the LEDs of the faceplate 728. The power converter and controller assembly 720 is configured to monitor a fan output signal from a cooling assembly and to monitor the signal to verify that it is functioning properly. The status of the fan can be indicated using the LEDs of the faceplate 728.

Example Cooling Modules

Figure 8:
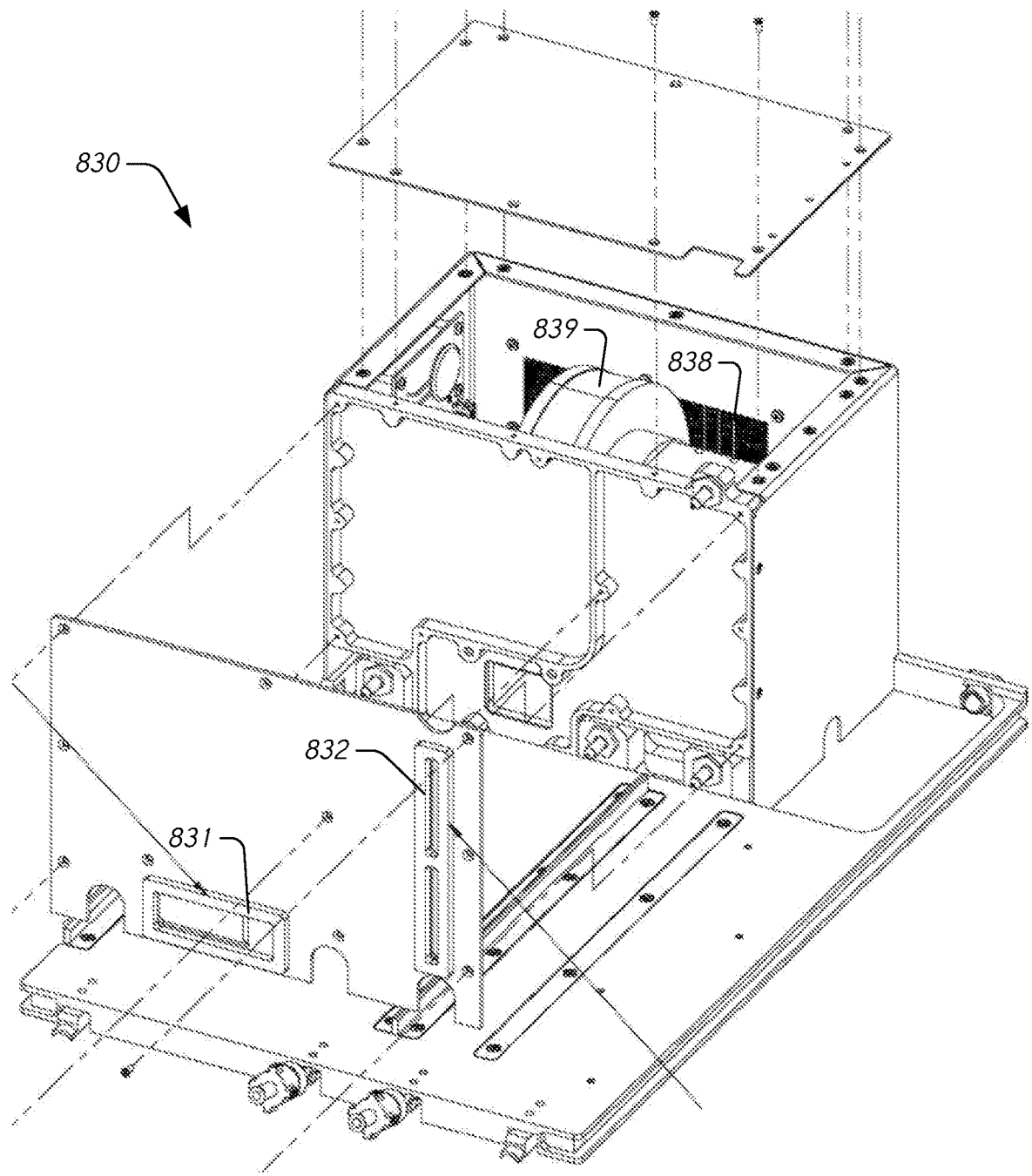
FIG. 8 illustrates an example cooling assembly.

FIG. 8 illustrates an example cooling assembly 830. Any of the cooling modules or assemblies described herein with respect to FIGS. 1A-6 can be the same as or similar to the cooling assembly 830. The cooling assembly 830 is configured to direct air through a radio and a radio power supply using a fan 839. The fan 839 draws air in through an intake port 838 and drives the air out the cooling ports 831, 832 to cool the radio and radio power supply. In some embodiments, the fan 839 provides cooling by drawing air in through the cooling ports 831, 832 and out through the intake port 838.

The cooling assembly 830 is configured to provide forced air cooling for a radio LRU and a radio power supply LRU configured for forced air cooling. The cooling assembly 830 can be itself an LRU as well.

The cooling assembly 830 can be configured to generate or to receive a voltage that controls the fan 839. In some embodiments, the voltage provides an ON/OFF signal to the fan 839. In some embodiments, the voltage provides variable speed control of the fan 839. The cooling assembly 830 can be configured to provide a fan output signal indicating the speed and/or power state of the fan 839 (e.g., ON or OFF). In some embodiments, the cooling assembly 830 can include a dedicated fan for the radio and a dedicated fan for the radio power supply.

In some embodiments, the cooling assembly 830 is configured to control the fan using a cooling algorithm. The cooling algorithm can vary the speed and power state of the fan 839 to cool the radio and radio power supply based at least in part on power provided to the radio power supply rather than controlling based on measured or sensed temperature. Advantageously, the cooling algorithm can improve power consumption, control fan noise, reduce complexity (e.g., by removing thermocouples from the cooling assembly), and the like. In some embodiments, the cooling algorithm can be controlled based at least in part on a measure of ambient temperature. The temperature can be measured in the cooling assembly 830 and/or at the intake port 838, for example.

Terminology

As used herein, the term module includes but is not limited to a modular component of a communications system that is designed to be replaced quickly. Furthermore, as used herein, the terms unit and/or module are interchangeable and may be considered to be similar to a line-replaceable unit (LRU) in that the terms refer to a substantially modular component that can be replaced as a whole rather than replacing individual elements of the unit or module. As used herein, the term length or length-wise, when used with reference to a unit or module, generally refers to a direction parallel to a longer dimension (excluding the height) of the unit and width or width-wise generally refers to a direction parallel to a shorter dimension (excluding the height) of the unit.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems and are not limited to the methods and systems described above, and elements and acts of the various embodiments described above can be combined to provide further embodiments. Accordingly, the methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio tray assembly comprising: a tray forming a radio mounting portion and a radio power supply mounting portion adjacent to the radio mounting portion, the radio mounting portion configured to receive a radio and the radio power supply mounting portion configured to receive a radio power supply in an orientation such that the radio and the radio power supply have lengths that are parallel to each other; a cooling module secured to the tray behind the radio mounting portion and the radio power supply mounting portion, the cooling module including a fan configured to direct air through the radio mounting portion and through the radio power supply mounting portion in a direction parallel to the lengths of the radio mounting portion and the radio power supply mounting portion; and a power converter and controller module secured to the tray adjacent to the radio power supply mounting portion and configured to convert a received electrical signal to a targeted electrical signal to power the radio power supply mounted to the tray.

2. The radio tray assembly of claim 1 further comprising a radio secured to the radio mounting portion and a radio power supply secured to the radio power supply mounting portion.

3. The radio tray assembly of claim 2, wherein the radio comprises a multifunctional information distribution system joint tactical radio system terminal (MIDS-JTRS) radio assembly.

4. The radio tray assembly of claim 1, wherein the radio tray assembly is configured to be installed to replace a multifunctional information distribution system low volume terminal (MIDS-LVT) radio assembly.

5. The radio tray assembly of claim 1, wherein the cooling module is oriented with its length perpendicular to the length of the radio mounting portion and the length of the radio power supply mounting portion.

6. The radio tray assembly of claim 1, wherein the cooling module includes a first cooling port configured to direct air through the radio mounting portion and a second cooling port configured to direct air through the radio power supply mounting portion.

7. The radio tray assembly of claim 1, wherein the power converter and controller module is oriented with its length parallel to the length of the radio mounting portion and the length of the radio power supply mounting portion.

8. The radio tray assembly of claim 1, wherein the power converter and controller module has a length that is greater than or equal to a sum of a length of the radio mounting portion and a width of the cooling assembly.

9. The radio tray assembly of claim 1, wherein the power converter and controller controls cooling of the cooling assembly based at least in part on power drawn by a radio installed on the radio mounting portion.

10. The radio tray assembly of claim 9, wherein the power converter controller controls a speed of a fan of the cooling assembly based at least in part on the power drawn.

11. The radio tray assembly of claim 1, wherein dimensions of the radio tray assembly are less than or equal to 8.4 in. in height, 13.2 in. in width, and 21 in. in length.

12. The radio tray assembly of claim 1, wherein dimensions of the radio mounting portion are less than or equal to about 7.5 in. in width and 13.5 in. in length.

13. The radio tray assembly of claim 1, wherein dimensions of the radio power supply mounting portion are less than or equal to about 2.525 in. in width and 13.46 in. in length.

14. The radio tray assembly of claim 1, wherein dimensions of the power converter and controller module are less than or equal to about 8.38 in. in height, 3 in. in width, and 20.88 in. in length.

15. The radio tray assembly of claim 1, wherein dimensions of the cooling assembly are less than or equal to about 8.38 in. in height, 7.26 in. in width, and 10.13 in. in length.

16. The radio tray assembly of claim 1, wherein the electrical signal received by the power converter and controller module receives is 110 VAC, 220 VAC, or 28 VDC.

17. The radio tray assembly of claim 16, wherein the targeted output signal is ±140 VDC.

18. The radio tray assembly of claim 1, wherein the power converter and controller includes user interface features that controls a power state of the radio tray assembly.

19. The radio tray assembly of claim 1, wherein the power converter and controller is configured to display status information.

20. The radio tray assembly of claim 19, wherein the status information is displayed using one or more LEDs.

* * * * *